(12) United States Patent
Corrigan et al.

(10) Patent No.: US 6,183,056 B1
(45) Date of Patent: Feb. 6, 2001

(54) THERMAL INKJET PRINTHEAD AND PRINTER ENERGY CONTROL APPARATUS AND METHOD

(75) Inventors: George H Corrigan, Corvallis, OR (US); John M Wade, Poway, CA (US)

(73) Assignee: Hewlett-Packard Company, Palo Alto, CA (US)

( * ) Notice: Under 35 U.S.C. 154(b), the term of this patent shall be extended for 0 days.

(21) Appl. No.: 08/958,951

(22) Filed: Oct. 28, 1997

(51) Int. Cl.[7] .......................... B41J 29/38; B41J 29/393; B41J 2/05
(52) U.S. Cl. .................................. 347/14; 347/19; 347/57
(58) Field of Search .................... 347/56, 61, 62, 347/57, 20, 14, 40, 12, 19, 17, 191

(56) References Cited

U.S. PATENT DOCUMENTS

| | | | |
|---|---|---|---|
| Re. 36,279 | * 8/1999 | Ujita | 347/14 X |
| 4,268,838 | 5/1981 | Nakano et al. | |
| 4,490,728 | 12/1984 | Vaught et al. | 347/60 |
| 4,540,991 | * 9/1985 | Kariya et al. | 347/191 |
| 4,791,435 | 12/1988 | Smith et al. | 347/17 |
| 5,036,377 | * 7/1991 | Rezanka | 347/17 X |
| 5,068,674 | * 11/1991 | Sato et al. | 347/62 |
| 5,072,235 | * 12/1991 | Slowik et al. | 347/19 |
| 5,083,137 | * 1/1992 | Badyal et al. | 347/14 |
| 5,109,234 | 4/1992 | Otis, Jr. et al. | 347/14 |
| 5,418,558 | 5/1995 | Hock et al. | 347/14 |
| 5,428,376 | 6/1995 | Wade et al. | 347/14 |
| 5,473,351 | 12/1995 | Helterline et al. | 347/19 |
| 5,475,405 | 12/1995 | Widder et al. | 347/14 |
| 5,497,174 | * 3/1996 | Stephany et al. | 347/14 X |
| 5,521,620 | * 5/1996 | Becerra et al. | 347/14 |
| 5,526,027 | 6/1996 | Wade et al. | 347/14 |
| 5,633,665 | * 5/1997 | Komuro | 347/57 X |
| 5,677,577 | * 10/1997 | Barbehenn et al. | 347/57 X |
| 5,682,185 | * 10/1997 | Wade et al. | 347/57 X |
| 5,691,750 | * 11/1997 | Edwards | 347/19 X |
| 5,726,690 | * 3/1998 | Bohorquez et al. | 347/19 X |
| 5,751,302 | * 5/1998 | Rezanka | 347/57 X |
| 5,754,193 | * 5/1998 | Elhatem | 347/57 X |
| 5,852,369 | * 12/1998 | Katsuma | 347/19 X |
| 6,039,430 | * 3/2000 | Helterline et al. | 347/19 |

FOREIGN PATENT DOCUMENTS

| | | | |
|---|---|---|---|
| 19613649 | * 4/1996 | (DE) . | |
| 0405574A2 | * 6/1990 | (EP) . | |
| 0650838A2 | * 10/1994 | (EP) . | |
| 0750988A2 | * 6/1996 | (EP) . | |
| 0819539A2 | * 7/1997 | (EP) . | |
| 60-206664 | * 10/1985 | (JP) | 347/14 |
| 61-197247 | * 9/1996 | (JP) | 347/14 |

\* cited by examiner

*Primary Examiner*—Susan S. Y. Lee

(57) ABSTRACT

A method of operating a thermal ink jet printer with a removable print head having a plurality of ink firing resistors, the operation including calibrating the printer by determining a nominal input voltage above a threshold necessary for simultaneous operation of a plurality of the resistors. Then, during printing, detecting the input voltage on the print head at an input node connected to the resistors and generating a firing pulse having a duration based on the detected input voltage at the node. Thus, a detected input voltage higher than the nominal voltage is compensated for by a shortened firing pulse. The method may be achieved in a removable ink jet print head having a connector with many electrical inputs connectable to a printer, and a voltage input node connected to the connector. The print head has numerous firing resistors connected to the input node. An energy control circuit is connected to the input node and is connected to the resistors to fire the resistors with a firing pulse having a duration inversely related to the voltage at the input node, such that the firing energy is maintained in control by varying the firing pulse duration to compensate for voltage variations.

30 Claims, 3 Drawing Sheets

THERMAL INKJET PRINTHEAD AND PRINTER ENERGY CONTROL APPARATUS AND METHOD

FIELD OF THE INVENTION

This invention relates to thermal ink jet printers, and more particularly to the control of droplet firing energy to provide a uniform output.

BACKGROUND AND SUMMARY OF THE INVENTION

Ink jet printing mechanisms use pens that shoot droplets of colorant onto a printable surface to generate an image. Such mechanisms may be used in a wide variety of applications, including computer printers, plotters, copiers, and facsimile machines. For convenience, the concepts of the invention are discussed in the context of a printer. An ink jet printer typically includes a print head having a multitude of independently addressable firing units. Each firing unit includes an ink chamber connected to a common ink source, and to an ink outlet nozzle. A transducer within the chamber provides the impetus for expelling ink droplets through the nozzles. In thermal ink jet printers, the transducers are thin film firing resistors that generate sufficient heat during application of a brief voltage pulse to vaporize a quantity of ink sufficient to expel a liquid droplet.

The energy applied to a firing resistor affects performance, durability, and efficiency. It is well known that the firing energy must be above a certain threshold to cause a vapor bubble to nucleate. Above this threshold in a transitional range, increasing the energy increases the drop volume expelled. Above a higher threshold at the upper limit of the transitional range, drop volumes do not increase with increasing energy. It is in this range in which drop volumes are stable even with moderate energy variations that printing ideally takes place, as variations in drop volume cause disuniformities in printed output. As energy levels increase above this optimal zone, uniformity is not compromised, but energy is wasted, and the printer components are prematurely aged due to excessive heating and ink residue build up.

In existing systems having a dedicated connection for each firing resistor, a one time calibration of each connection by printer or production circuitry external to the pen also compensates for any parasitic resistance or impedance in the unique path leading to each resistor. Print heads may be characterized at production to set these operating parameters.

However, in highly multiplexed print heads having different sets of nozzles, each set addressed by a common voltage line, there may be variations due to other factors. Each set of nozzles is powered by a single voltage line that receives power via an electrical contact pad between the printer electronics and the removable print cartridge. This line continues on a flex circuit to a tab bonding connection to the print head die having other electronics, including the firing resistors. The impedance of the print cartridge contacts, tab bonding connections, and connections in between can vary from cartridge to cartridge, from nozzle to nozzle, and over time, even when the voltage provided by the printer to each of the cartridge contacts is well controlled. Consequently, as printed data changes, the current draw through the line and the voltage as measured at the pen terminals may be undesirably varied. For instance, when many or all nozzles are fired simultaneously, the pen voltage may be depressed by parasitic effects, giving a lower firing energy than when only one or a few nozzles are fired.

The present invention overcomes the limitations of the prior art by providing a method of operating a thermal ink jet printer with a removable print head having a plurality of ink firing resistors, the operation includes calibrating the printer by determining a nominal input voltage above a threshold necessary for simultaneous operation of a plurality of the resistors. Then, during printing, detecting the input voltage on the print head at an input node connected to the resistors and generating a firing pulse having a duration based on the detected input voltage at the node. Thus, a detected input voltage higher than the nominal voltage is compensated for by a shortened firing pulse. The method may be achieved in a removable ink jet print head having a connector with many electrical inputs connectable to a printer, and a voltage input node connected to the connector. The print head has numerous firing resistors connected to the input node. An energy control circuit is connected to the input node and is connected to the resistors to fire the resistors with a firing pulse having a duration inversely related to the voltage at the input node, such that the firing energy is maintained in control by varying the firing pulse duration to compensate for voltage variations.

DETAILED DESCRIPTION OF A PREFERRED EMBODIMENT

Figure 1:
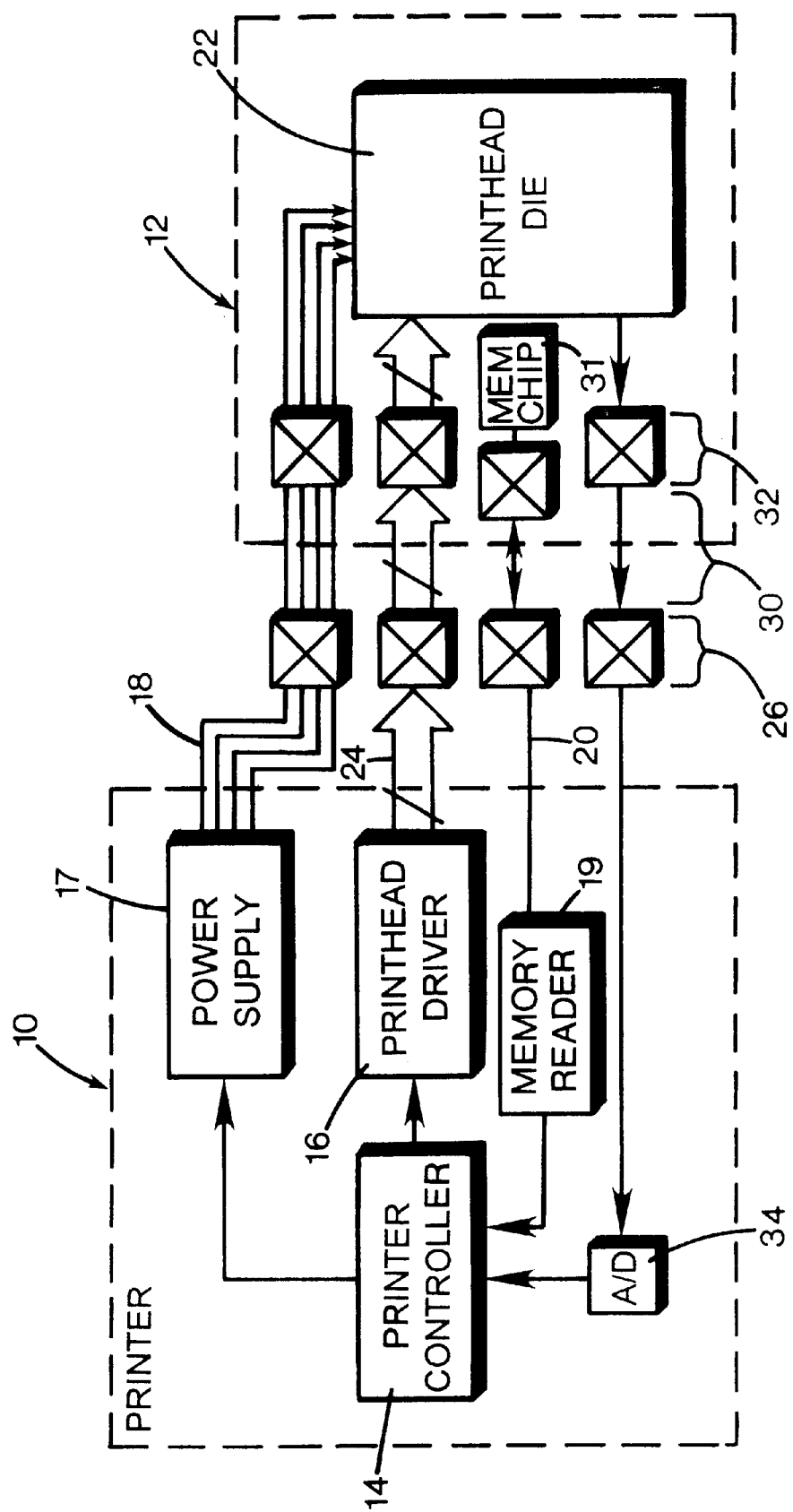
FIG. 1 is a schematic block diagram of a thermal ink jet printing apparatus according to a preferred embodiment of the invention.

FIG. 1 shows a schematic block diagram of an ink jet printer 10 with a connected print cartridge 12. A controller 14 in the printer receives print data from a computer or microprocessor (not shown) and processes the data to provide printer control information or image data to a print head driver circuit 16. A controlled voltage power supply 17 provides to a four line power bus 18 a controlled supply voltage. A memory reader circuit 19 in the printer is connected to the controller for transmitting information received from the print cartridge 12 via a memory line 20. The print head driver circuit is controlled by the controller to send the image data to a print head die 22 on the print cartridge 12, via a control bus 24 that has about twenty lines.

The cartridge is removably replaceable, and is electrically connected to the printer by the control bus 24, power bus 18, memory line 20 and thermal data line to be discussed below. A connector interface 26 has a conductive pin for each line on the printer side contacting a corresponding pad on a flexible circuit 30 on the cartridge 12. A memory chip 31 on the cartridge stores printer control information programmed at production of the cartridge, or by the printer during use. The flex circuit 30 is connected to the print head die 22 via tab bonds 32. An analog-to-digital converter 34 in the printer is connected to the print head to receive data from the print head that indicates the print head's temperature.

The print head has 524 nozzles, each with an associated firing resistor. The print head is arranged into four similar quadrants, each having eight "primitives" of 16 nozzles each, plus four primitives of three nozzles each. To provide a multiplexed function requiring only a limited number of lines between the printer and print head, resistor current flows through a voltage line and a ground line shared by other resistors in its quadrant. The resistors are individually addressable to provide unlimited pattern permutations, by a serial data stream fed from the print head.

Figure 2:
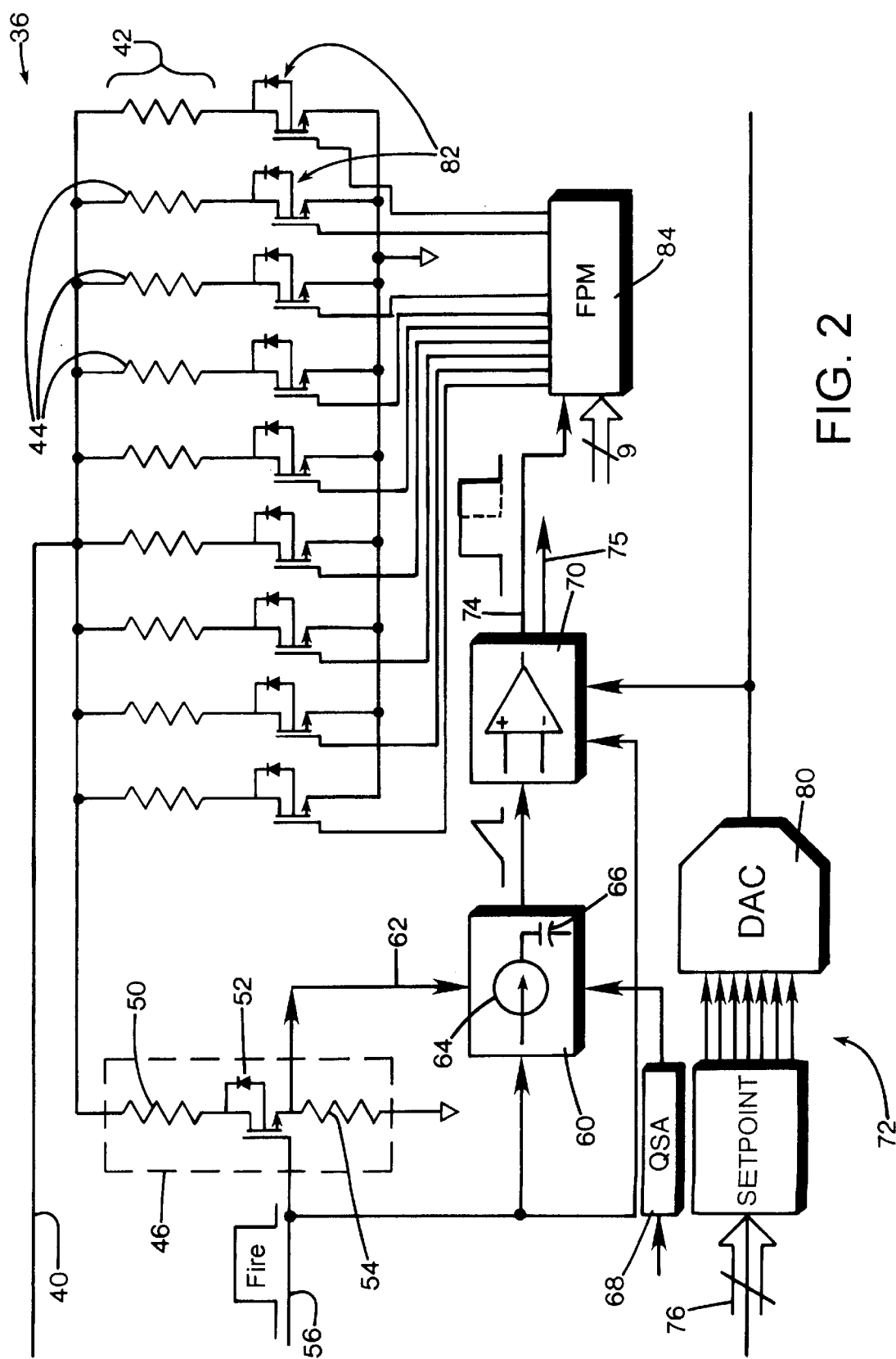
FIG. 2 is a detailed schematic of a print head circuit of the embodiment of FIG. 1.

FIG. 2 shows a firing and energy control circuit 36 of a representative quadrant of the die, and showing an exemplary fraction of the many resistors of the quadrant (an nth one of the sixteen of the fill primitive.) The circuit 36 resides on the print head die and has a single voltage input line (Vpp) 40 from the power bus 18 commonly connected to a set 42 of thin film firing resistors 44, each preferably 28 Ω. A voltage sensing network 46 includes a high value resistor 50 having ten times the resistance (280 Ω) of any of the firing resistors, and connected to the input line 40 at the same node as the firing resistors. The sensing network further includes a LDMOS switch 52 having an input connected to the resistor 50, an output connected to a sense resistor 54 having a low value (10 Ω) relative to the firing resistors, and a control line connected to a firing line 56 from the printer. The sense resistor is connected to ground.

A voltage-to-power converter circuit 60 has a primary input line 62 connected between the switch 52 and sense resistor 54. A firing input is connected to the firing line 56, so that a pulse on the firing line triggers the converter's operation. The converter includes a bias current generator 64 and an integration capacitor 66. A voltage provided to the converter is converted to a power signal, which is used to generate a bias current that is fed to the integration capacitor, creating an output voltage that is proportional to energy. A quadrant slope adjuster (QSA) circuit 68 has an output connected to the converter circuit to adjust its rate of output voltage increase, or output slope, stored in the QSA register, having been loaded from the printer controller, this data having been received from the memory chip. In the preferred embodiment, each QSA provides a +/−5% adjustment in the slope, so that small variations in performance and energy requirements among the quadrants may be controlled and compensated for. Each quadrant has its own such QSA, so that each may be adjusted slightly. A wider adjustment range may be implemented where desired.

A pulse width control block 70 includes logic for pulse width truncation and a continuous-time voltage comparator has a first input connected to the output of the converter 60 (which transmits the energy signal), a second input connected to the output of a DAC, which is in turn controlled by a setpoint voltage reference device 72, and a control line connected to the firing line 56. The control block's comparator has an output line 74 that transmits a voltage pulse, which is initiated upon triggering by a pulse on the firing line, and when the output of the converter 60 equals the output of the converter 80, or when the fire pulse terminates, whichever occurs first. A truncation detect signal on a second comparator output line 75 provides status information to control logic circuitry indicating that the circuit has truncated the fire pulse. This signal is used for calibration purposes.

The setpoint reference voltage device 72 includes a 7-line bus 76 connected to an internal register loaded by the printer, and a 7-bit digital-to-analog-converter (DAC) 80 connected to convert a digitally encoded voltage value received from the printer to a reference voltage output. The converter 80 has an output voltage that allows a delivered energy range of 1 μJ to 7 μJ. In the preferred embodiment, the converter 80 is a precision poly resistor string combined with an analog switch matrix.

Each firing resistor 44 is connected to a corresponding firing switch 82 connected to a ground line, and having a control input connected to the output of a fire pulse modulator 84. The fire pulse modulator receives print data on a 9 bit bus, and outputs a firing signal to each selected firing switch.

In operation, the system is calibrated as discussed below to set a Vpp level adequate to ensure adequate firing energy levels for full drop volume firing in "blackout conditions" when all resistors are fired simultaneously. Because firing energy is proportional to the product of the square of the voltage and the time duration, Vpp must be high enough to provide adequate energy within the limited time afforded for printing each dot, before the next dot is to be printed at the desired printer scan rate. Part of the calibration process includes establishing a setpoint voltage to provide a limited firing energy threshold for all firing condition, regardless of the number of nozzles fired simultaneously.

To fire a selected group of the resistor set 42, the printer sends a voltage Vpp on line 40, and transmits a full-duration firing pulse on line 56. In response to the firing pulse, the comparator transmits the firing pulse to the resistor firing switches 82, causing the selected switches to close, connecting the resistors to ground for current flow to generate firing energy. Also in response to initiation of the firing pulse on line 56, the switch 52 opens, allowing a small current to flow through resistors 50 and 54, with the voltage between the resistors on line 62 being proportional to the Vpp on line 40 as affected by the current drawn by the activated resistors.

The firing pulse also triggers the converter circuit 60 to reset the capacitor to zero, zeroing the output voltage. The input voltage is converted to a power signal by conventional analog circuitry. The power signal is then used to generate a bias current that is fed into the integration capacitor 66, creating an output voltage ramp with a slope proportional to the energy dissipated during the pulse. The rate of voltage rise is further modified based on the stored data in the quadrant slope adjustment circuit 68, which has been based on initial manufacturing calibrations discussed below.

When the output voltage reaches a preselected setpoint voltage determined experimentally at operational calibration (as will be discussed below,) the comparator of control block 70 terminates the pulse transmitted on line 74 to the firing resistors. In this process, when Vpp is higher due only to a limited number of resistors being selected for firing, the voltage at line 62 will be higher, and the rate of charging of the capacitor will be increased. Consequently, the pulse will be terminated after a shorter duration to maintain a consistent energy delivered. In the event that Vpp drops below the point determined during calibration, and the capacitor voltage does not reach the setpoint before the printer firing pulse ends, the printer fire pulse will override the comparator and terminate energy delivery. It is possible to compensate for such low Vpp conditions by lengthening the firing pulse slightly after calibration, as long as the requirements of pen frequency and printing speed are not violated.

To operationally calibrate an installed print head cartridge to compensate for parasitic resistances in the printer and the printer-to-cartridge connection, Vpp is set by the printer to a default value based on a test operation in which nozzles are fired one quadrant at a time to generate the worst case possible parasitic voltage drops at the input lines for each of the sets of resistors across all of the primitives at its maximum firing frequency. As the printer must have adequately fast throughput and carriage scan speed, the voltage is set with a firing pulse somewhat briefer than the desired time between pulses (i.e. less than [scan speed/dot pitch]+margin). With this nominal maximum pulse duration, the default voltage is set to ensure that all nozzles are firing fully, above the transitional range discussed in the background of the invention. The determination of proper firing and function above the transitional range is conducted by means well known in the field of thermal ink jet printing.

With a default Vpp established, an energy calibration mode is enabled. In this mode, the energy control circuitry, including the sense network 46, converter 64, and control block 70 are activated. The printer again delivers signals to generate firing from all nozzles of all primitives with the setpoint voltage set at a relatively high initial level Vs1 to provide a high firing energy well beyond the transitional range. This process is repeated at sequentially lower setpoint voltages Vs2, Vs3, etc. until the onset of pulse width truncation indicates that an optimum firing energy level has been reached. This is achieved by firing a pulse at nominal voltage, then checking a truncation status bit indicating whether a pulse was properly fired, then lowering the voltage by a small increment, and repeating the process. During this calibration process, the status bit is set when the firing pulse is still high or active when the comparator trips. If the firing pulse drops or terminates before the comparator trips, the status bit is not set. When the voltage is at a low enough level, firing will not occur, and conventional printer drop sensing circuitry, which may include optical drop detectors, will set the status bit to a state indicating non-firing. The setpoint voltage is set above this non-firing voltage by a margin of safety to ensure firing. Preferably, the setpoint voltage is set so that the firing pulse duration is no longer than 2 $\mu$s, to avoid reliability problems associated with longer duration low voltage pulses. Such reliability problems arise when a too-high power is applied during a short duration to obtain the needed energy. Such extreme power creates high rates of temperature change in the resistors, which generates potentially damaging stresses. Optionally, the operational calibration process may continue until a sufficiently low setpoint is reached so that all quadrants are experiencing pulse truncation, thereby ensuring that none of the quadrants are firing at higher than needed energy levels. Ensuring truncation throughout the system also provides a margin for pulse expansion in unexpectedly low Vpp conditions.

Figure 3:
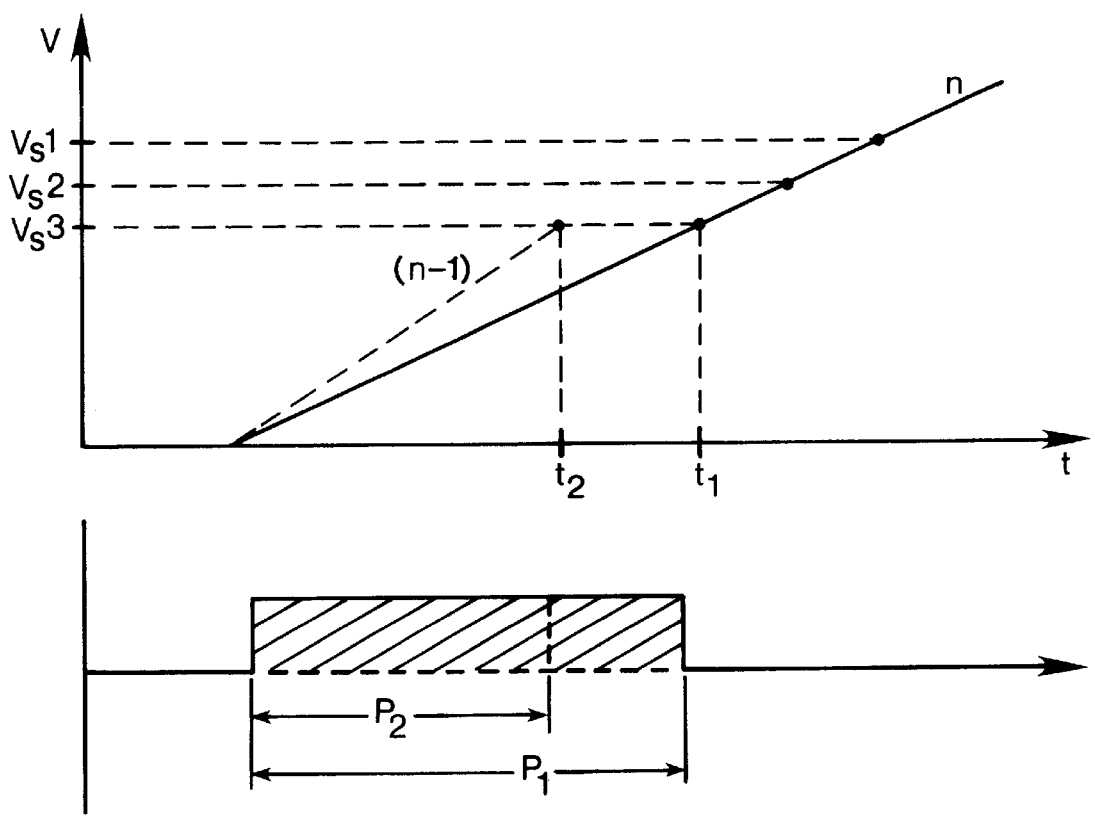
FIG. 3 is graph showing an internal voltage and logic condition plotted against time under different circumstances.

FIG. 3 illustrates how operational calibration and printing occur. In the upper portion of the graph, the vertical axis reflects the voltage at the converter 64 output. As shown, the solid line "n" reflects a rising voltage as energy is dissipated by all n resistors firing. During calibration, the setpoint voltage is stepped down as shown until a suitable pulse width and printing performance is attained at Vs3. The voltage line n reaches the selected setpoint at time t1, terminating the pulse P1 as shown in the lower portion of the graph, which reflects the pulse output to the firing resistors at line 74. During subsequent operation after calibration, when less than all resistors are fired, such as with line (n−1) reflecting all resistors fired but one, the slope of the voltage line is steeper, causing it to reach the selected setpoint voltage Vs3 at an earlier time t2, providing a truncated pulse having duration P2 to compensate for the increased Vpp and yield a consistent firing energy.

Prior to delivery and use, the pen undergoes a one-time factory calibration process to compensate for quadrant-to quadrant variations within the pen cartridge in pen resistors and internal trace resistances. Although the resistances in the printer, and in the power connections between the printer carriage and the pen tend to differ from printer to printer, and with different installations of the same pen in the same printer, the variations internal to a given pen are best identified and compensated for as an end manufacturing process. Internal pen variables include pen flex circuit power and ground line resistance, flex circuit-to-die tab bond resistance, die traces connecting each quadrant to power and to ground, and semiconductor process and resistor variations. Compensating for these variables at manufacturing minimizes the diagnostic circuitry requirements of the printer, and limits calibration delays upon pen installation by the user.

Factory calibration serves to identify the operational differences between the four functional quadrants of the print head die, in particular the different resistances in the traces and connections for each different quadrant. Also, the resistor dimensions may vary within tolerances, and these variations may tend to be consistent within each quadrant, and different between quadrants. In addition, the semiconductor manufacturing process may generate variations that are minimal within each quadrant, but which create variations within each die, from quadrant to quadrant.

Calibration of the print head is made at an energy level somewhat in excess of the nominal firing energy, so that any unexpected resistances, such as caused by a marginally poor cartridge-to-printer connection, may be compensated for. The nominally excessive energy is compensated for by the pulse width truncation approach discussed above. In the preferred embodiment, an "over energy" level of 20%, or 1.2 times nominal, is selected.

Initially, with the energy compensation circuit turned off (so that truncation does not occur), the pulse width is set to 2.0 $\mu$sec, a maximum nominal pulse width. At this pulse width, each quadrant of the pen is separately operated with all of its nozzles firing, with the other three quadrants inactive. The turn on voltage of each quadrant is determined, and the quadrant with the highest turn on voltage Vh is identified.

Factory calibration continues by turning on the energy compensation circuit. The QSA 68 in the highest voltage quadrant (with voltage Vh) is set at the maximum +5% by manufacturing circuitry connected to the cartridge by the standard printer connections. The voltage Vpp on the power line to the high quadrant is set at Vpp=Vh√1.2 (the 1.2 being based on the desired "over energy" level of 1.2 times nominal.) While firing all the resistors of this quadrant only, the DAC 80 is adjusted in a binary search mode until the pulse width for the quadrant begins to truncate, that is, at the lowest voltage level at which truncation occurs. The QSA value of +5%, and the determined DAC setting are written to the memory chip 31 by the external manufacturing circuitry.

The remaining quadrants are calibrated one at a time, firing all resistors of the quadrant "x" to determine a turn on voltage Vx. Using the DAC setting established in calibrating the first "Vh" quadrant, the input Vpp is then set at Vpp= Vx√1.2, and the QSA is adjusted by a binary descent mode until the pulse width for that quadrant just truncates. The QSA setting for this quadrant is written to the memory chip, and the process is repeated for each quadrant. Following manufacturing calibration, the memory chip contains a single DAC setting, and four independent QSA settings, one for each quadrant.

Factory calibration includes storing a nominal operating voltage Vop, which is used to enable the printer in which the pen is eventually installed to determine whether there are intolerably high parasitic resistances that were not detectable in the pen alone during factory calibration. Such resistances might occur with a printer wiring fault, or a poor conduction at the pen-printer contacts. If a high resistance were encountered, the system circuitry would compensate with a higher input voltage Vpp. This is acceptable up to a point, but a high Vpp needed to overcome resistance when all resistors are firing, will lead to a much higher voltage at a single firing resistor. Of course, this can be compensated for by substantial pulse width truncation to achieve controlled energy, but beyond a certain point, the resistor is unable to reliably withstand the power transmitted, as discussed above.

Therefore, the factory calibration determines Vop by firing all nozzles of all quadrants, and stepping Vpp up until the highest turn on voltage quadrant just truncates. Voltage is stepped down one increment, and this voltage is written as Vop to the memory chip in the pen cartridge. With the memory chip thus programmed, the cartridge may be delivered to a user, either in conjunction with a printer, or as a replacement cartridge.

When installed in a printer by the user, the printer will perform a test on the pen cartridge to determine the correct power supply voltage Vps for that pen. First, the printer reads the operating voltage Vop from the pen's memory chip, and sets Vps=Vop. Then, the printer operates with all nozzles of all quadrants firing, in blackout mode, and reads the pulse width truncation flags for each quadrant. The power supply voltage Vps is stepped up until all quadrants are truncating, and defines that voltage as Vtrunc. Then, the processor calculates the amount by which Vtrunc (the voltage needed to operate under blackout conditions) exceeds Vop. If this difference is below an acceptable limit stored ion the printer controller, Vps is lowered by a single increment below Vtrunc, and the printer operated at this voltage.

If the (Vtrunc-Vps) difference exceeds the preselected limit, the pen reliability may be jeopardized by further operation, and the printer generates a fault message advising the user to reinstall the pen cartridge. If the unexpected resistance leading to the excessive Vtrunc was due to a bad contact between printer and cartridge, such as by a particle between contact pin and contact pad, the reinstallation is likely to cure the problem. If reinstallation does not solve the problem, a fault message advises servicing the printer, and may disable printer operation to prevent damage.

While the above is discussed in terms of preferred and alternative embodiments, the invention is not intended to be so limited.

What is claimed is:

1. A method of operating a thermal ink jet printer including a removable print head having a plurality of ink firing resistors comprising the steps:
    calibrating the printer by determining a nominal input voltage above a threshold necessary for simultaneous utilization of a plurality of the resistors;
    during printing, detecting the input voltage on the print head at an input node connected to at least some of the resistors; and
    generating a firing pulse having a duration based on the detected input voltage at the node, such that a detected input voltage higher than the nominal voltage is compensated for by a shortened firing pulse.

2. The method of claim 1 wherein calibrating includes firing all resistors to simulate a worst case voltage draw down condition.

3. The method of claim 1 wherein calibrating includes determining a maximum pulse duration to achieve a desired printing rate, and setting the nominal input voltage above a threshold needed to fire a maximum number of resistors.

4. The method of claim 1 wherein calibrating includes sequentially firing at least some of the resistors using progressively lower voltages.

5. The method of claim 1 wherein detecting the input voltage includes connecting the input node to a current sensor.

6. The method of claim 1 wherein generating the firing pulse includes connecting the input node to a capacitive device having an output control voltage that rises in relation to current fed to the input node.

7. The method of claim 1 wherein generating the firing pulse includes initiating the pulse, and while the pulse is continuing to deliver energy to the resistors, generating a rising setpoint voltage proportional to the energy delivered to the resistors, and when the setpoint voltage rises to a preselected threshold, terminating the pulse.

8. The method of claim 1 wherein including determining whether an excessive parasitic resistance is present by comparing an operating voltage in the printer with a preselected voltage value stored on a memory device in the print head.

9. The method of claim 8 including generating an error message in response to a determination that the operating voltage exceeds the preselected voltage value by more than a predetermined margin.

10. A removable ink jet print head comprising:
    a connector having a plurality of electrical inputs connectable to a printer;
    a voltage input node connected to the connector;
    a plurality of firing resistors connected to the input node;
    an energy control circuit connected to the input node and operably connected to the resistors to simultaneously fire at least a plurality of the resistors with a firing pulse having a duration inversely related to the voltage at the input node.

11. The apparatus of claim 10 wherein the energy control circuit includes a voltage to energy converter for estimating the energy provided to the resistors.

12. The apparatus of claim 11 including a voltage comparator having an input connected to the converter, and output operably connected to the resistors to deliver a pulse having a limited duration terminating when the output of the converter rises above a preselected threshold voltage.

13. The apparatus of claim 12 including a digital-to-analog converter connected to the comparator and operable to generate the preselected threshold voltage in response to a digital control code.

14. The apparatus of claim 10 wherein the energy control circuit includes a capacitor that accumulates a charge in relation to the voltage at the input node and to the time connected to the input node.

15. The apparatus of claim 10 including a firing input operably connected to a switch between the input node and the energy control circuit, such that the energy control circuit is disconnected from the input node until the switch is closed by the leading edge of a firing pulse on the firing input.

16. The apparatus of claim 15 wherein the firing input is operably connected to the firing resistors such that current begins to flow to at least selected of the resistors in response to initiation of a firing pulse on the firing input.

17. The apparatus of claim 10 including a memory device connected to the connector and having a first memory location containing a plurality of voltage correction values each based on an operating characteristic of a distinct set of at least one of the firing resistors.

18. The apparatus of claim 10 including a memory device connected to the connector and having a memory location containing a preselected nominal operating voltage value, such that the printer may determine whether excessive parasitic resistance is causing an excessive operating voltage exceeding the preselected nominal operating voltage value by more than a preselected margin.

19. A method of operating a thermal ink jet printer including a removable print head having a plurality of ink firing resistors comprising the steps:

calibrating the printer by determining a nominal input voltage above a threshold necessary for simultaneous operation of a plurality of the resistors;

printing by generating firing pulses during which selected resistors are connected between an input node and ground to generate thermal energy in the resistors;

during printing, continually estimating the amount of energy dissipated in the selected resistors during each pulse; and ending the firing pulse when the energy dissipated reaches a preselected level.

20. The method of claim 19 wherein the nominal input voltage is above a threshold necessary for simultaneous operation of all resistors.

21. The method of claim 19 wherein continually estimating the energy includes detecting the input voltage.

22. The method of claim 19 wherein continually estimating the energy includes converting the input voltage to an accumulated energy value.

23. The method of claim 22 including increasing a control voltage in proportion to the accumulated energy value.

24. The method of claim 23 wherein the step of ending the firing pulse occurs in response to the control voltage reaching a preselected setpoint.

25. A method of calibrating a thermal ink jet print head having a plurality of ink firing resistors groups each containing at least one resistor, and a memory device having a plurality of memory locations, the method comprising the steps:

operating each group to determine an optimal operating voltage value for each of the groups;

for each group, calculating a voltage correction value based on the optimal operating voltage value; and for each group, storing the voltage correction value in a different one of the memory locations.

26. The method of claim 25 wherein the step of determining an optimal operating voltage value includes firing all the resistors in the group.

27. The method of claim 25 including the step of connecting the print head to a piece of calibration equipment located in a manufacturing facility remote from an end user of the print head.

28. The method of claim 25 including the step of after storing the voltage correction values, packaging the print head for shipment to an end user.

29. The method of claim 28 including the steps of:

transferring the print head to an end user;

installing the print head in a printer;

transferring the voltage correction values from the memory device to the printer; and operating the printer by applying an operating voltage to the resistors of a selected group based on the voltage correction value associated with the selected group.

30. The method of claim 29 including changing the operating voltage of the printer as different groups of resistors are driven.

* * * * *